(12) United States Patent
Pramanik et al.

(10) Patent No.: US 9,275,727 B2
(45) Date of Patent: *Mar. 1, 2016

(54) MULTI-LEVEL MEMORY ARRAY HAVING RESISTIVE ELEMENTS FOR MULTI-BIT DATA STORAGE

(71) Applicants: Intermolecular Inc., San Jose, CA (US); Kabushiki Kaisha Toshiba, Tokyo (JP); SanDisk 3D LLC, Milpitas, CA (US)

(72) Inventors: Dipankar Pramanik, Saratoga, CA (US); David E Lazovsky, Los Gatos, CA (US); Tim Minvielle, San Jose, CA (US); Takeshi Yamaguchi, Kanagawa (JP)

(73) Assignees: Intermolecular, Inc., San Jose, CA (US); Kabushiki Kaisha Toshiba, Tokyo (JP); SanDisk 3d LLC, Milpitas, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 14/627,760

(22) Filed: Feb. 20, 2015

(65) Prior Publication Data
US 2015/0310910 A1 Oct. 29, 2015

Related U.S. Application Data

(63) Continuation of application No. 13/721,279, filed on Dec. 20, 2012, now Pat. No. 8,995,166.

(51) Int. Cl.
*G11C 11/00* (2006.01)
*G11C 11/56* (2006.01)
(Continued)

(52) U.S. Cl.
CPC .............. *G11C 11/56* (2013.01); *G11C 7/1006* (2013.01); *G11C 7/1051* (2013.01); *G11C 7/1078* (2013.01); *G11C 7/12* (2013.01); *G11C 7/22* (2013.01); *G11C 11/5685* (2013.01); *G11C 13/004* (2013.01); *G11C 13/0007* (2013.01);
(Continued)

(58) Field of Classification Search
CPC ........... G11C 13/0069; G11C 13/0004; G11C 13/0007; G11C 13/004; G11C 7/1006; G11C 7/1051; G11C 7/1078; G11C 7/22; G11C 7/12
USPC ................ 365/148, 100, 115, 189.02, 230.02
See application file for complete search history.

(56) References Cited

U.S. PATENT DOCUMENTS 7,054,214 B2 * 5/2006 Hanzawa .................. G11C 7/14
365/189.02
7,499,313 B2 * 3/2009 Katti .......................... G11C 7/02
365/158

(Continued)

*Primary Examiner* — Pho M Luu

(57) ABSTRACT

A resistor array for multi-bit data storage without the need to increase the size of a memory chip or scale down the feature size of a memory cell contained within the memory chip is provided. The resistor array incorporates a number of discrete resistive elements to be selectively connected, in different series combinations, to at least one memory cell or memory device. In one configuration, by connecting each memory cell or device with at least one resistor array, a resistive switching layer found in the resistive switching memory element of the connected memory device is capable of being at multiple resistance states for storing multiple bits of digital information. During device programming operations, when a desired series combination of the resistive elements within the resistor array is selected, the resistive switching layer in the connected memory device can be in a desired resistance state.

20 Claims, 7 Drawing Sheets

(51) Int. Cl.
*G11C 13/00* (2006.01)
*G11C 7/10* (2006.01)
*G11C 7/22* (2006.01)
*G11C 7/12* (2006.01)
*H01L 45/00* (2006.01)
*H01L 27/24* (2006.01)

(52) U.S. Cl.
CPC ........ *G11C 13/0069* (2013.01); *H01L 27/2481* (2013.01); *H01L 45/145* (2013.01); *H01L 45/1608* (2013.01); *G11C 2213/32* (2013.01); *G11C 2213/33* (2013.01); *G11C 2213/34* (2013.01); *G11C 2213/72* (2013.01); *H01L 27/2409* (2013.01); *H01L 27/2436* (2013.01)

(56) References Cited

U.S. PATENT DOCUMENTS

| | | | |
|---|---|---|---|
| 8,995,166 B2* | 3/2015 | Pramanik | G11C 13/0069 365/100 |
| 9,099,176 B1* | 8/2015 | Buskirk | G11C 13/0002 |
| 2008/0080226 A1* | 4/2008 | Mikolajick | G11C 7/1006 365/148 |

* cited by examiner

MULTI-LEVEL MEMORY ARRAY HAVING RESISTIVE ELEMENTS FOR MULTI-BIT DATA STORAGE

CROSS REFERENCE TO RELATED APPLICATIONS

This is a Continuation Application of U.S. patent application Ser. No. 13/721,279 filed Dec. 20, 2012 (now U.S. Pat. No. 8,995,166), which is herein incorporated by reference for all purposes.

BACKGROUND

1. Technical Field

Provided are methods of forming resistive switching memory devices and arrays and storing N bits of data in resistive switching memory devices. Provided also are various structural features of resistive switching memory devices and arrays.

2. Description of the Related Art

Nonvolatile memory devices are used in systems in which persistent storage is required. For example, nonvolatile memory cards are used in digital cameras to store images and in digital music players to store audio data. Nonvolatile memory devices are also used to persistently store data in computer environments.

Electrically-erasable programmable read only memory (EEPROM) technology is often used to form and program nonvolatile memory devices. This type of nonvolatile memory contains floating gate transistors that can be selectively programmed or erased by application of suitable voltages to their terminals. As fabrication techniques improve, it is becoming possible to fabricate nonvolatile memory devices at increasingly smaller dimensions. However, as device dimensions shrink, scaling issues pose challenges for traditional nonvolatile memory technology. This has led to the investigation of other alternatives, including nonvolatile resistive switching memory technology.

Resistive Random Access Memory (RRAM or ReRAM) is often made by interconnecting a number of nonvolatile resistive switching memory cells into memory arrays, such as cross point ReRAM arrays, in order to increase the density of the resistive switching memory cells connected together in a memory chip. Nonvolatile resistive switching memory devices and systems are formed using bistable resistive switching memory cells. A current steering element, such as a diode, is often used to prevent cross-talk between the interconnected memory devices from affecting the stored data in other memory devices within the memory array. The diode only allows limited programming and erasing currents to pass through the resistive switching memory element in desired directions.

Each memory cell or device has a resistive switching memory element capable of being placed at a high resistance state (HRS, e.g., a logic "0" state) or a low resistance state (LRS, e.g., a logic "1" state) by applying suitable voltages or currents. For example, voltage pulses are generally used to switch the resistive switching memory element from one resistance state to the other. Nondestructive read and write operations are performed to ascertain the value of a data bit that is stored in a resistive switching memory device.

As each resistive switching memory element is only capable of being at two stable resistance states (HRS and LRS) to function in conjunction with one current steering element as a memory unit, only one (1) data bit per unit can be stored. Therefore, there is a need for resistive switching memory devices and arrays to be able to switch among multiple resistance states for storing more than 1 bit of data (e.g., multiple bits, N>1) in order to increase the amount of the data storage without the need to increase the size of a memory unit or the size of a memory array (and hence the size of a memory chip).

SUMMARY

Certain embodiments include a method of storing multiple bits of data using discrete resistive elements that are disposed in a memory device without increasing the size of a memory chip or causing the feature sizes within the memory device or memory cell to be reduced to fit in the same area on a memory chip. In one embodiment, a resistor array is provided to function with at least one resistive switching memory cell or memory device. The resistor array includes a plurality of resistive elements (e.g., two or more layers of resistive elements for more than two resistance states) that is used to program each resistive switching memory cell or memory device into more than two resistance states.

The resistor array that has the plurality of the resistive elements is in electrical communication with the at least one resistive switching memory cell or device so that it can place the at least one resistive switching memory device into multiple resistance states for storing a desirable N bits of data. In certain embodiments, N is a natural number that is greater than one (1). In the same or other embodiments, the memory device is capable of being programmed into at least $2^N$ logic states. Furthermore, the resistor array may be capable of placing the resistive switching memory devices at $2^N$ number of resistance states for storing N bits of data. In certain embodiments, a memory device is provided and includes one or more resistive switching memory elements configured to store N bits of data, wherein N is a natural number of more than one. The memory device further includes a resistor array electrically connected to the one or more resistive switching memory elements.

In one aspect, the resistance state of each resistive switching memory element is controlled by the total resistance of the resistor array. In another aspect, the resistor array includes two or more resistive elements, where each resistive element is selectively configured to be at an "on" resistance state with its own resistance value. In one embodiment, the total resistance of the resistor array is provided by the resistance values of the selected resistive elements that are at the "on" resistance state within the resistor array. In general, a resistor array is in electrical communication and connected with one or more resistive switching memory elements, wherein the resistor array includes a plurality of resistive elements (e.g., two or more resistive elements).

In one embodiment, the resistor array includes two or more resistive elements and two or more electrode layers. In other embodiment, the resistor array further includes a multiplexer connected to each of the two or more resistive elements. Each resistive element can be electrically turned on to be at an "on" resistance state with its resistance value, such that the two or more resistive elements can be selectively connected in $2^N$ numbers of different combinations and provide $2^N$ number of possible resistance values as a total resistance of the resistor array provided to control the resistance of any of the one or more resistive switching memory elements of the memory device. Accordingly, the resistor array is capable of controlling the total resistance of the memory device and placing a resistive switching memory element connected thereto at $2^N$ number of different resistance states.

In other embodiment, the resistor array may include at least $2^N-1$ number of resistive elements, where the material and the thickness of each resistive element within the resistor array are adjusted to provide each resistive element with the same resistance value, R, at its "on" resistance state. Thus, the total resistance of the resistor array is determined to be M*R, where M is an integer that varies between 1 and $2^N$, and each resistive switching memory element is programmed to a desirable resistance equaling to M*R.

In certain embodiments, a resistive switching memory device has at least one resistive switching memory element for storing two (2) bits of data (e.g., to be placed in four (4) resistive states) is provided. The resistive switching memory device includes a resistive switching memory element and a resistor array having three ($2^2-1=3$) or more resistive elements and capable of being in electrical communication with the resistive switching memory element and placing the resistive switching memory element at four ($2^2=4$) resistance states.

In certain embodiments, a method of forming a resistive switching memory device is provided. The method includes forming two or more layers of resistive elements into a resistor array, and forming a metal conductive layer within the resistor array. In one embodiment, the metal conductive layer is connected to a resistive switching memory element of the resistive switching memory device.

In certain embodiments, a method of storing N bits of data in a resistive switching memory device is provided. The method includes selectively connecting N layers of resistive elements within a resistor array, wherein N is a natural number of more than one, and wherein the resistor array comprises the N layers of resistive elements and a metal conductive layer; and electrically connecting the metal conductive layer of the resistor array to one or more resistive switching memory elements of the resistive switching memory device. In one embodiment, an electrode layer of the resistive switching memory device is connected to the metal conductive layer of the resistor array. In another embodiment, each resistive element has its own resistance value when electrically turned on and each layer of the resistive element within the resistor array is selectively connected and electrically turned on.

In certain embodiments, a method of storing N bits of data includes connecting layers of resistive elements of a resistor array in $2^N$ number of different series combinations via $2^N$ number of electrode layers within the resistor array. The method further includes connecting the resistor array with a resistive switching memory device. In one embodiment, the resistor array is capable of placing the resistive switching memory device at $2^N$ number of resistance states for storing N bits of data.

BRIEF DESCRIPTION OF THE DRAWINGS

So that the manner in which the above recited features can be understood in detail, a more particular description of certain aspects of, briefly summarized above, may be had by reference to embodiments, some of which are illustrated in the appended drawings. It is to be noted, however, that the appended drawings illustrate only typical embodiments and are therefore not to be considered limiting of its scope, for other equally effective embodiments may be admitted.

Figure 1:
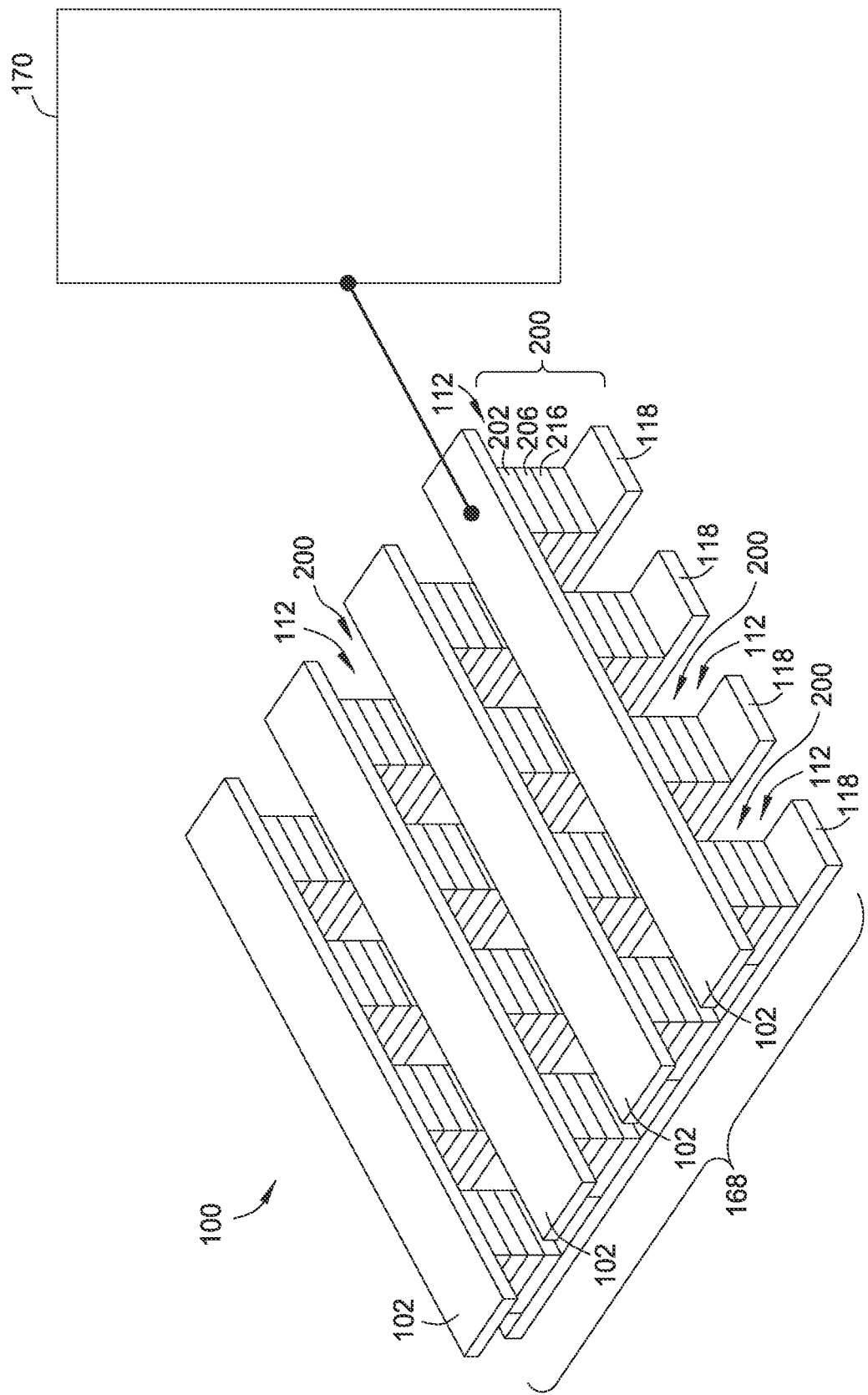
FIG. 1 illustrates one example of a three dimensional (3D) multi-level memory array having at least one resistor array and at least one memory device, in accordance with certain embodiments.

While the foregoing is directed to embodiments, other and further embodiments may be devised without departing from the basic scope thereof, and the scope thereof is determined by the claims that follow.

DETAILED DESCRIPTION

Certain embodiments include a method of using a resistor array in an array of resistive switching memory cells and memory devices to store more than 1 bit of data information in a selectively controllable manner. The resistor array is electrically connected to at least one resistive switching memory device, resistive switching memory cell, or resistive switching memory element. In one embodiment, each memory array or memory device includes one or more resistive switching memory cells or one or more resistive switching memory elements. Each resistive switching memory cell may include a resistive switching memory element.

In one aspect of the invention, the resistance state of a memory device, a resistive switching memory cell, or a resistive switching memory element is controlled by the total resistance of the resistor array such that each memory device, resistive switching memory cell, or resistive switching memory element can be selectively is configured to store N bits of data, wherein N is a natural number of more than one.

The resistor array incorporates a plurality of discrete resistive elements, and each resistive element can be electrically turned off (no resistance) or turned on to an "on" resistance state, thereby providing a resistance (with its own resistance value, depending on the thickness, the length, and material of each resistive element). In addition, the plurality of the resistive elements can be electrically connected with each other (e.g., selectively in different series combinations).

In one embodiment, for storing N bit of data, at least $2^N-1$ resistive elements (e.g., $2^N$ number of resistive elements) are provided. When the at least $2^N-1$ resistive elements within the resistor array are electrically connected, there are at least $2^N$ number of possible electrical connections (e.g., $2^N$ number of different series combinations of the $2^N-1$ resistive elements). Each of the resistive elements within the resistor array can be selectively turned to the "on" resistance state, such that the total resistance of the resistor array is provided by the added resistances of all of the resistive elements that are at "on" resistance state within the resistor array. Since the resistive elements can be at $2^N$ number of possible electrical connections (thus $2^N$ possible added resistance values of the connected "on" resistive elements), the total resistance of the resistor array is any of the $2^N$ possible added resistance values of the "on" resistive elements. In other words, depending on the selection and connection of the resistive elements, in a resistor array with at least $2^N-1$ resistive elements, there are $2^N$ possible total resistance values that can be selectively provided to a resistive switching memory cell or memory device.

In another embodiment, the total resistance of the resistor array is used to control the resistance state of a resistive switching memory cell or memory device that the resistor array is connected to electrically such that the resistive switching memory cell is capable of being at multiple resistance states (e.g., $2^N$ possible total resistance values) and thus store multiple bits of digital information.

The plurality of the resistive elements within the resistor array can be selectively connected with a resistive switching layer in a resistive switching memory element of a memory device (e.g., a memory cell). The structure of the resistor array is controllably configured to set a discrete resistance state in the resistive switching layer of the memory cell. As an example, a resistor array having a plurality of resistive elements (e.g., two or more resistive elements) can be connected to the resistive switching layer disposed in a resistive switching memory element of a resistive switching memory cell for storing a desirable number (N) of data bits, where N is a natural number (e.g., N is a natural number of more than one, such as an integer of two or more). As a comparison, conventional resistive switching memory cells can only store one (1) bit of data, as a result of a resistive switching memory element's bistable resistance (two stable resistance states, a high resistance state (HRS) for a logic "0" state and a low resistance state (LRS) for a logic "1" state).

Each resistive element within the formed resistor array can be controlled by a multiplexer and/or a de-multiplexer. The multiplexer or a de-multiplexer may include a plurality of switches to selectively turn on and program the plurality of the resistive elements into different "series" combinations. Each resistive element within the resistor array can be controlled by a switch (e.g., a transistor) within the multiplexer or the de-multiplexer. In one configuration, the plurality of the resistive elements (e.g., at least $2^N-1$ resistive elements, such as $2^N$ number of resistive elements) within the resistor array are stacked together in a three-dimensional (3D) multi-level manner. In this configuration, the plurality of the resistive elements can be disposed in a vertical line within the resistor array, or at a lateral plane (i.e., parallel to the substrate surface), each vertical or lateral line having at least one resistive element disposed therein, so that each resistive element within the resistor array can be individually controlled to be turned "on" or "off" without the need for placing additional transistors between a resistive switching memory cell and the resistor array.

In one embodiment, the resistive elements (e.g., at least $2^N-1$ resistive elements) are connected "in series" with each other (e.g., capable being in $2^N-1$ or more numbers of different "series" combinations) to form a 3D multi-level resistor array. Connecting the plurality of the resistive elements in different "series" combinations allows the resistor array to have multiple possible resistances (e.g., $2^N$ or more possible resistance values for a resistor array). By turning on a selected combination of the resistive elements within the resistor array and delivering a selected current level to the resistive switching memory cell connected to the resistor array, the resistance state of each connected resistive switching memory cell can be selectively changed from one resistance state to another resistance state among the $2^N$ or more possible resistance values. During programming, a controller (e.g., a control circuit) is able to program the resistor array into a desired resistance and place a connected resistive switching memory cell in a desired resistance state.

Accordingly, in certain embodiments, a resistor array is used to provide a plurality of possible resistances to set a resistive switching layer in a resistive switching memory element into a plurality of possible resistance states for multi-bit data storage. In the same or other embodiments, the resistor array provides each resistive switching memory cell a desired resistance among the plurality of possible resistances and sets each resistive switching memory cell into a desired resistance state. For example, by connecting the plurality of the resistive elements in different series combinations to at least one resistive switching memory cell, the resistor array can selectively allow a desired current level among a plurality of possible current levels to flow through the connected resistive switching memory cell. As a result, the connected resistive switching memory cell can be selectively adjusted to switch among multiple resistance states (e.g., more than two resistance states) by adjusting the supplied programming current to controlled levels, thus increasing the capacity of each resistive switching memory cell for storing more than one data bit (e.g., 2 or more data bits).

In certain embodiments, the resistor array is capable of being in electrical communication with at least one resistive switching memory cell to form a three-dimensional (3D) multi-level memory array such that the resistive switching memory cell is capable of being at multiple resistance states (e.g., at $2^N$ number of resistance states), which is more than the conventional two HRS and LRS states. In one configuration, by connecting at least one resistor array with at least one resistive switching memory cell in a memory array, the resistor array is capable of placing a resistive switching layer within the memory cell in multiple resistance states for storing multiple bits of digital information. In one embodiment, each memory cell in a memory array is connected in series with the resistor array.

In certain embodiments, during programming operations, a desired resistance state of the resistive switching layer can be obtained when a desired combination of the resistive elements within the resistor array is controllably selected. For example, a control circuit for programming within a memory array can be used to select a desired resistance state among the possible number of resistance states (correlated with desired storage bits) to be programmed and connect an appropriate set of resistive elements within the interconnected 3D multi-level resistor array so that a resistive switching memory cell connected to the resistor array within the memory array can be placed into the desired resistance state. The use of such resistor array does not require the size of a memory chip or the feature size of memory device elements contained within a memory chip to be scaled down.

FIG. 1 illustrates one example of a memory array 100 having at least one resistor array 170 connected to a device assembly 168 of memory devices (e.g., one or more resistive switching memory cells 200) in accordance with certain embodiments. In one example, one or more resistor arrays 170 may form into a resistor assembly for connecting to the one or more memory cells 200 of the device assembly 168. The memory array 100 may be a cross point memory array formed by a plurality of the resistive switching memory cells 200 and a plurality of resistor arrays 170.

Conventionally, when applying a fixed voltage or current to a memory cell or memory device, a gate transistor can be used in series with the memory cell to provide different levels of resistances and control the current flowing through the memory cell to be under a set compliance current ($I_{CC}$) level. However, the use of a transistor dramatically increases the size of the memory cell and thus is not compatible with the demanding feature sizes used to form today's memory cells and memory arrays. An additional set of control lines or bit-lines are required to connect each of the additional gate transistors to provide a way to change its compliance current level, and thus are generally not compatible with the architecture of a crossbar memory array.

In certain embodiments, one or more resistor array 170 are used to selectively control and repeatably obtain multiple resistance states for each memory cell 200 disposed in the memory array 100, without the need to change the overall 3D architecture of the memory cell 200 or the memory array 100. In addition, the resistor array 170 can be readily integrated with any type of memory arrays or memory devices.

In FIG. 1, each memory cell 200 generally includes one or more conductive layers. The one or more conductive layers may include an electrode 102 and an electrode 118 disposed in the upper and lower sides of the memory cell 200. The memory cells 200 can be accessed and connected to the resistor array 170 individually or in groups using appropriate sets of word-lines and bit-lines formed by the electrodes 102 and 118.

Figure 2:
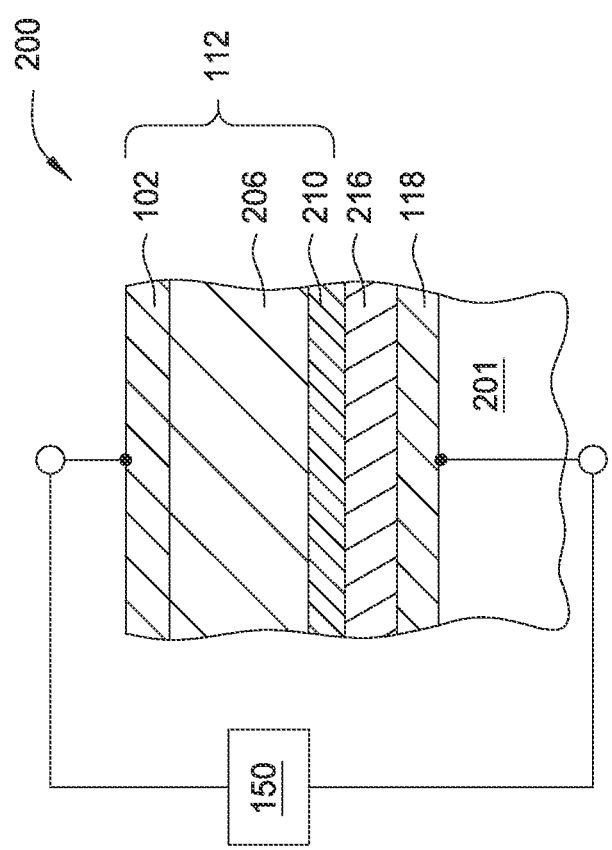
FIG. 2 is a schematic cross-sectional view of a resistive switching memory element disposed in a nonvolatile memory device, in accordance with certain embodiments.

In one embodiment, the memory cell 200 includes at least one resistive switching memory element 112, which includes a resistive switching layer 206, and one or more additional material layers 202. For example, the resistive switching memory element 112 may contain an MIM (metal-insulator-metal) stack, where an insulator material layer is stacked between two or more conductive metal material layers. The conductive metal material layers may be a top electrode layer (e.g., the electrodes 102), an intermediate electrode layer (e.g., an intermediate electrode layer 210 as shown in FIG. 2), a bottom electrode layer (e.g., the electrode 118). As an example, the insulator material layer may be a resistive switching layer 206 stacked between the electrodes 102 and 118 or, alternatively, between the electrode 102 and the intermediate electrode layer 210, thus forming the MIM stack.

The memory cell 200 may include resistive switching metal oxide insulator material layer (e.g., the resistive switching layer 206) that offers bistable resistance for a memory cell and is capable of adjusting the resistance state of the conventional resistive switching metal oxide insulator material layer. The insulator material layer is usually the resistive switching layer 206, which includes a dielectric material that can be switched between at least two stable resistance states. For example, the resistive switching layer 206 may contain a metal oxide material, such as hafnium oxide ($Hf_xO_y$), tantalum oxide ($Ta_xO_y$), aluminum oxide ($Al_xO_y$), lanthanum oxide ($La_xO_y$), yttrium oxide ($Y_xO_y$), dysprosium oxide ($Dy_xO_y$), ytterbium oxide ($Yb_xO_y$) and zirconium oxide ($Zr_xO_y$), among others.

Optionally, the memory cell 200 further includes a current steering device, which can be a diode-type current steering element (e.g., a current steering element 216). The current-steering element 216 functions to allow current to flow through the memory cell 200, preferentially in a forward direction ("I$^+$").

FIG. 2 illustrates an example of the memory cell 200 having the resistive switching memory element 112 and the current steering element 216 disposed therein, in accordance with certain embodiments. The memory cell 200 includes the electrode 118 disposed above the surface of a substrate 201, the current steering element 216 disposed above the surface of the electrode 118, an intermediate electrode layer 210 disposed above the surface of the current steering element 216, the resistive switching layer 206 disposed above the surface of the intermediate electrode layer 210, and the electrode 102 disposed above the surface of the resistive switching layer 206.

In certain embodiments, the electrodes 102 and 118 may each include two or more conductive layers in which a first conductive layer is used to interconnect a number of the memory cells 200 and/or the resistor array 170, and a second conductive layer is disposed in each memory cell 200 to provide a desirable electrical interface (e.g., desirable work function) to adjacent components in the memory cell 200. In addition, the intermediate electrode layer 210, as shown in FIG. 2, is disposed near the resistive switching layer 206 to provide a desirable electrical interface (e.g., desirable work function). For example, the intermediate electrode layer 210 can function as a metal layer for the MIM (metal-insulator-metal) stack of the resistive switching memory element 112.

In certain embodiments, the current steering element 216 is an intervening electrical component, such as a p-n junction diode, p-i-n diode, transistor, or other similar device that is disposed between a bottom electrode layer (e.g., the electrode 118) and the resistive switching memory element 112. Alternatively, the current steering element 216 can also be disposed between a top electrode layer (e.g., the electrode 102) and the resistive switching memory element 112. For example, the current steering element 216 may include two or more layers of semiconductor material, such as two or more P-doped or N-doped silicon layers, configured to direct (e.g., allow or inhibit) the current flow through the memory cell 200 in different directions during device operations. In one example, the current steering element 216 is a diode that comprises a p-doped silicon layer (not shown), an un-doped intrinsic layer (not shown), and an n-doped silicon layer (not shown) that has an overall resistance between about 1 k$\Omega$ and about 100 M$\Omega$.

The overall resistance of the current steering element 216 generally depends on the type of current steering element 216 that is formed and based on direction of current flow through the memory cell 200 (e.g., forward or reversed biased). Alternatively, a high-capacity nonvolatile memory integrated circuit may contain a MOS-type transistor or other types of transistors to regulate current flow. Because of the design of the material layers within current steering element 216, a reduced current can also flow in the opposing direction through the memory cell 200 by the application of a reverse bias to the electrodes 102 and 118.

Figure 3:
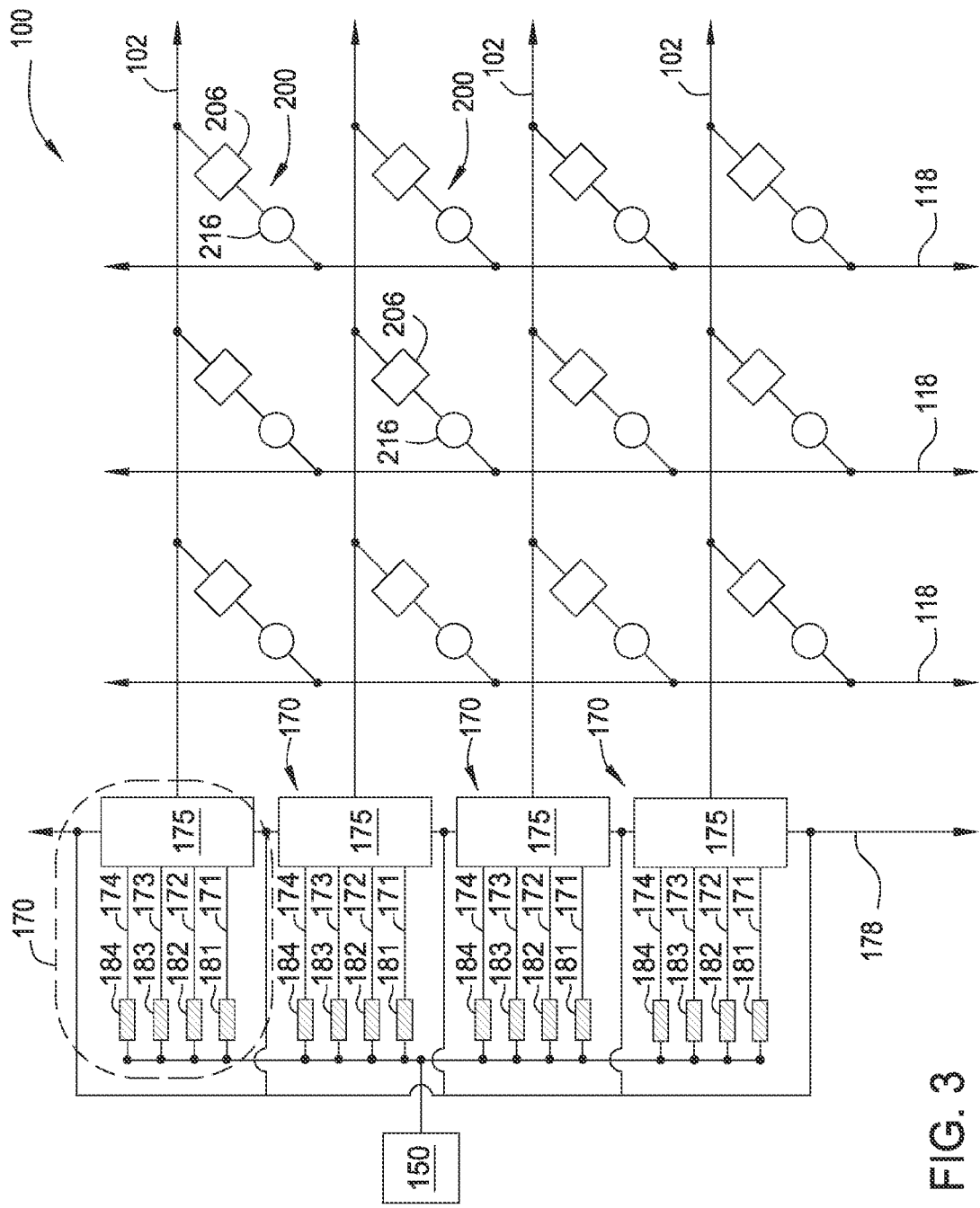
FIG. 3 illustrates one example of a memory array having at least one resistor array and at least one memory device, in accordance with certain embodiments.

FIG. 3 illustrates one example of forming the memory device 100 having the resistor array 170. In certain embodiments, the resistor array 170 includes a plurality of resistive elements 181, 182, 183, 184 and a plurality of electrodes (e.g., electrodes 171, 172, 173, 174). In general, one or more resistive elements are formed over, or integrated with and distributed over, a portion of the surface of a substrate 201, which can be for example, any semiconductor wafers, semiconductor substrates, silicon substrates, SOI substrates, among others. Each resistive element within each resistor array 170 can be accessed individually or in groups using appropriate sets of word-lines and bit-lines, conveniently formed by one or more conductive layers, (e.g., the electrodes 171, 172, 173, 174). Optionally, the resistor array 170 may include additional material layer. The examples shown here are mere illustrative and not an exhausting list of all examples. For example, additional resistive elements and additional material layers can be formed in the resistor array 170.

In FIG. 3, the memory array 100 can be stacked in a vertical fashion or in other configuration to form various types of multilayered memory array structures. The use of the resistive switching memory elements 112, the resistive switching layer 206, the current-steering element 216, the one or more material layers 202, the resistive elements 181, 182, 183, 184, and the electrodes 171, 172, 173, 174 to form the memory array 100, as shown in FIG. 3, is merely illustrative, and one skilled in the art would appreciate that the formed memory cells or devices may be used in other device applications.

The resistive elements 181, 182, 183, 184 may each include a resistive material layer deposited to a thickness of between 50 angstroms and about 500 angstroms over the surface of the substrate 201 using a deposition process, such as an atomic layer deposition (ALD), chemical vapor deposition (CVD), physical vapor deposition (PVD), or other similar process. In one embodiment, the resistive material includes a resistive metal material, doped semiconductor, and conductive dielectric material. For example, various polysilicon materials (e.g., n-type semiconductor materials, p-type semiconductor material, or doped polysilicon materials, etc.), low bandgap semiconductor materials (e.g., amorphous silicon, zinc oxide ($Zn_xO_y$), etc.) can be used. Various doped polysilicon materials can be used by adjusting the concentrations of a dopant, such as phosphorus (P), arsenic (As), boron (B), aluminum (Al), and the like. In one example, polysilicon is a suitable material as its resistivity can be modified by suitable doping and it is a semiconductor material that can withstand high voltages and current densities. As an example, the resistive elements 181, 182, 183, 184 can be an N-type resistor or a P-type resistor formed from a semiconductor material. As another example, the resistive elements 181, 182, 183, 184 may contain a metal nitride material (e.g., silicon nitride ($Si_xN_{1-x}$), hafnium nitride ($Hf_xN_y$), tantalum nitride ($Ta_xN_y$), titanium nitride ($Ti_xN_y$), etc.), a ternary intermetallic material (e.g., tantalum silicon nitride ($Ta_xSi_yN_z$), titanium silicon nitride ($Ti_xSi_yN_z$), titanium aluminum nitride ($Ti_xAl_yN_z$), etc.), a ceramic metal alloy material (e.g., chromium silicon oxide ($Cr_xSi_yO_z$) among others.

In one example, the resistive elements 181, 182, 183, 184 comprise a resistive metal layer formed using an ALD, CVD or PVD process and comprised of titanium nitride ($Ti_xN_y$), tantalum nitride ($Ta_xN_y$), hafnium nitride ($Hf_xN_y$), silicon nitride ($Si_xN_{1-x}$), tantalum silicon nitride ($Ta_xSi_yN_z$), titanium silicon nitride ($Ti_xSi_yN_z$), or titanium aluminum nitride ($Ti_xAl_yN_z$). In another example, each of the resistive elements 181, 182, 183, 184 may include a material layer of amorphous silicon, zinc oxide ($Zn_xO_y$), or chromium silicon oxide ($Cr_xSi_yO_z$) formed to a thickness of between about 5 Å and 500 Å using a PVD process.

The resistor array 170 may include, for example, a plurality of resistive elements 181, 182, 183, 184 to be selectively connected "in series" by a number of the electrodes 171, 172, 173, 174. Each resistive element within each resistor array 170 can be accessed individually or in groups using appropriate sets of word-lines and bit-lines, conveniently formed by one or more conductive layers, (e.g., the electrodes 171, 172, 173, 174). The resistive elements 181, 182, 183, 184 within the resistor array 170 can be fabricated using similar fabrication processes and techniques used for fabricating memory devices, and one or more resistor arrays 170 and one or more memory cells 200 can be fabricated at the same time and/or on the same substrate. The connections of the plurality of the resistive elements 181, 182, 183, 184 in each resistor array 170 can be programmed after fabrication, and then be connected to one or more designated memory cells 200 to be in close proximity to each of the connected memory cells 200 so that parasitic and RC time constant effects can be reduced. Thus, the resistor array 170 is compatible with connecting to a large variety of memory cells and devices.

Each resistor array 170 can be positioned on various places of a memory chip that contain the memory array 100, such that each resistor array 170 can be connected to one or more memory cell 200 (or memory device) to control the resistance states of the one or more memory cell 200. Each resistive elements 181, 182, 183, 184 of the resistor array 170 may include a resistive material that can be programmed and turned "on" by delivering a voltage or current through each resistive element 181, 182, 183, 184.

Thus, the resistive elements 181, 182, 183, 184 in each resistor array 170 functions as a set of variable resistors, capable of providing a resistance value, "$R_{181}$", "$R_{182}$", "$R_{183}$", "$R_{184}$", respectively, when a current or voltage is applied. For example, by applying a fixed voltage level to the resistor array 170 and delivering a desirable output current level to a memory cell 200 connected to the resistor array 170, the output resistance value in each resistor array 170, in turn, controls the resistance state of the connected memory cell 200.

The output resistance within the resistor array 170 can be adjusted by selecting the materials, the length and/or the thickness of the resistive elements 181, 182, 183, 184 that are disposed in different series combinations. For example, the output resistance of the resistor array 170 may be "0", $R_{181}$", "$R_{182}$", "$R_{183}$", "$R_{184}$", "$R_{181}+R_{182}$", "$R_{181}+R_{183}$", "$R_{181}+R_{184}$", "$R_{182}+R_{183}$", "$R_{182}+R_{184}$", "$R_{183}+R_{184}$", "$R_{181}+R_{182}+R_{183}$", "$R_{182}+R_{183}+R_{184}$", among others.

The resistor array 170 may further include a multiplexer 175 (or alternatively a de-multiplexer), which is individually connected to the resistive elements 181, 182, 183, 184 via the electrodes 171, 172, 173, 174. The multiplexer 175 is able to selectively connect the resistive elements 181, 182, 183, 184 in different "series" combinations to one or more memory cells 200. Each multiplexer 175 of the resistor array 170 can be connected to at least one memory cell 200 within the memory array 100 via at least one word line (e.g., an electrode 102) or at least one bit line (e.g., an electrode 118). The multiplexer 175 can be formed by connecting appropriate memory cells in a predetermined circuitry using transistors that are fabricated on a substrate prior to, or in conjunction with, forming the memory array 100.

In one embodiment, the material and the thickness for each of the resistive elements 181, 182, 183, 184 can be adjusted to have the same resistance value, "R", and thus the total output resistance of the resistor array 170 can be controlled to be "0" if no resistive element is programmed; a resistance value of "1R" if one resistive element is connected to the memory cell 200; a resistance value of "2R" if two resistive elements are connected in series to the memory cell 200; or a resistance value of "3R" if three resistive elements are connected in series to the memory cell 200, and so on. For example, each resistive element in the resistor array is capable of being programmed to have the same resistance value (R) by adjusting the material and thickness of each resistive element and placing the at least one resistive switching memory element to a desirable resistance equals to M*R, where M is an integer that varies between 1 and $2^N$. Accordingly, the connected memory cell 200 can have a total of at least four (4) possible resistance states with a desirable resistance value of "0", "1R", "2R", "3R" based on the example presented in FIG. 3. Additional resistive elements and material layers can be formed within the resistor array 170 to provide additional total resistance values, thus additional possible resistance states in each of the memory cells 200 within the memory array 100.

In one configuration, the resistive element 181 may be disposed in series with the electrode 171 (as shown in FIG. 3). In another configuration, the resistive element 181 is disposed between the electrodes 171, 172 by depositing a resistive material-containing layer over the surface of the substrate 201 using an ALD, CVD, PVD or other similar process and then depositing the electrode 172 layer using an ALD, CVD, PVD or other similar process. Next, the resistive element 182 is disposed next to the electrode 172 or between the electrodes 172, 173 by depositing a resistive material-containing layer over the surface of the substrate 201 using an ALD, CVD, PVD or other similar process (e.g., as shown in FIG. 4B, a resistive element 182A is formed between two metal layers 407 for connecting to a metal conductive layer 410 and other metal electrode layers or other material layers). Then, the resistive element 183 is deposited over the surface of the substrate 201 using an ALD, CVD, PVD or other similar process. In addition, the electrodes 171, 172, 173, 174 can be deposited over the surface of the substrate 201 using an ALD, CVD, PVD or other similar process.

In one embodiment, the resistive elements 181, 182, 183, 184 are disposed in series with the electrodes 171, 172 173, 174 in the formed resistor array 170 and are connected to a read-and-write circuitry 150 using word-lines and orthogonal bit-lines (generally referred herein as the electrodes 102, 118, 171, 172 173, 174) to program data into the memory cells 200 in a memory array 100.

In certain embodiments, a memory array 100 comprises a plurality of the resistor arrays 170 connected to one or more memory cells 200 through a word line, bit line, etc., for example, the electrodes 102 or the electrode 118, as shown in FIG. 3. In certain embodiments, multiple levels of memory cells 200 that are interconnected in three dimensions (3D) are included in the memory array 100, and one or more resistor arrays 170 are connected to one or more of the word, bit, or source lines. In one embodiment, one or more resistor arrays 170 are disposed in one or more vertical lines, instead of one lateral plane, within the memory array 100 to obviate the need for fabricating additional switching transistors in connecting one or more resistor arrays 170 to at least one resistive switching memory cell 200 within the memory array 100.

A plurality of bit lines, word lines, and source-lines (e.g., the electrodes 102, 118, 171, 172 173, 174) within the memory array 100 are typically biased by at least one circuitry, such as the read-and-write circuitry 150. The arrays of the memory cells 200 are generally connected to the read-and-write circuitry 150, which is often located at the periphery of a memory chip. For example, the electrodes 102, 118, 171, 172 173, and/or 174 can be biased by the read-and-write circuitry 150.

In general, the electrodes 102, 118, 210 171, 172, 173, 174 are formed from a conductive material, such as a highly conductive semiconductor material (e.g., p-type polysilicon, n-type polysilicon) and/or a conductive metal material (e.g., transition metals, transition metal alloys, transition metal nitrides, and transition metal carbides, titanium nitride (TiN), aluminum (Al), tungsten (W), among others) to minimize the circuit resistance created between the interconnected memory cells and devices and the resistor array 170 within the memory array 100. The electrodes 102, 118, 171, 172, 173, 174 disposed in the memory array 100, as shown in FIGS. 1, 3, 4A, and 5, are generally formed from a conductive material that has a desirable conductivity and work function. In some configurations, these electrodes may be formed from different materials. In one example, the electrodes comprise a metal, metal alloy, metal nitride or metal carbide formed from an element selected from a group consisting of titanium (Ti), tantalum (Ta), tungsten (W), cobalt (Co), molybdenum (Mo), nickel (Ni), vanadium (V), hafnium (Hf) aluminum (Al), copper (Cu), platinum (Pt), palladium (Pd), iridium (Ir), ruthenium (Ru), and combinations thereof. In another example, the electrodes comprise a metal alloy selected from the group of a transition metal, transition metal alloy (e.g., a titanium-aluminum alloy), transition metal carbide, transition metal nitride, (e.g., titanium nitride (TiN), tantalum nitride (TaN), or a silicon-doped aluminum (AlSi)), and combinations thereof.

In another example, the electrodes 102, 118 may comprise a metal nitride material (e.g., titanium nitride (TiN), tantalum nitride (TaN)), and the intermediate electrode layer 210 may comprise a heavily doped semiconductor material, such as a heavily doped silicon material (e.g., n-type polysilicon material) that interfaces well with the current steering element 216. For example, the intermediate electrode layer 210 may comprise a polysilicon material and is between about 50 Å and about 500 Å thick, and the electrodes 102, 118, 171, 172, 173, 174 are between about 50 Å and 5000 Å thick, and comprise a conductive metal material, such as titanium nitride (TiN). The electrodes 102, 118, 210, 171, 172, 173, 174 can be formed over a surface of a substrate 201 by a deposition process, including CVD (e.g., LPCVD, PECVD), ALD (e.g., PEALD), physical vapor deposition (PVD), liquid deposition processes, ion implants, and epitaxial processes to a thickness from 50 Å to 500 Å.

Figure 4A:
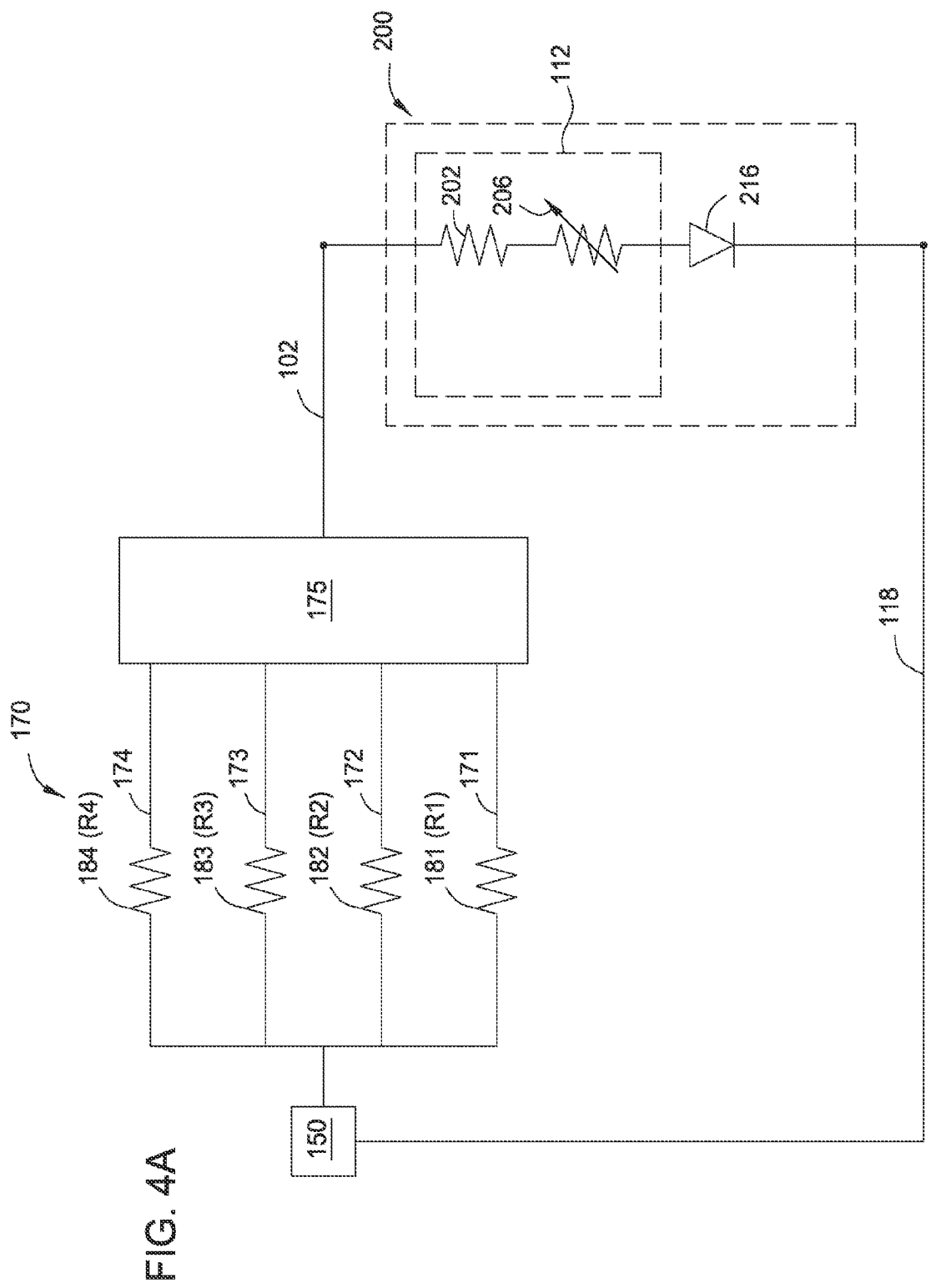
FIG. 4A is a schematic representation of one example of electrical communication between an illustrative resistor array and an illustrative memory device, in accordance with certain embodiments.
Figure 4B:
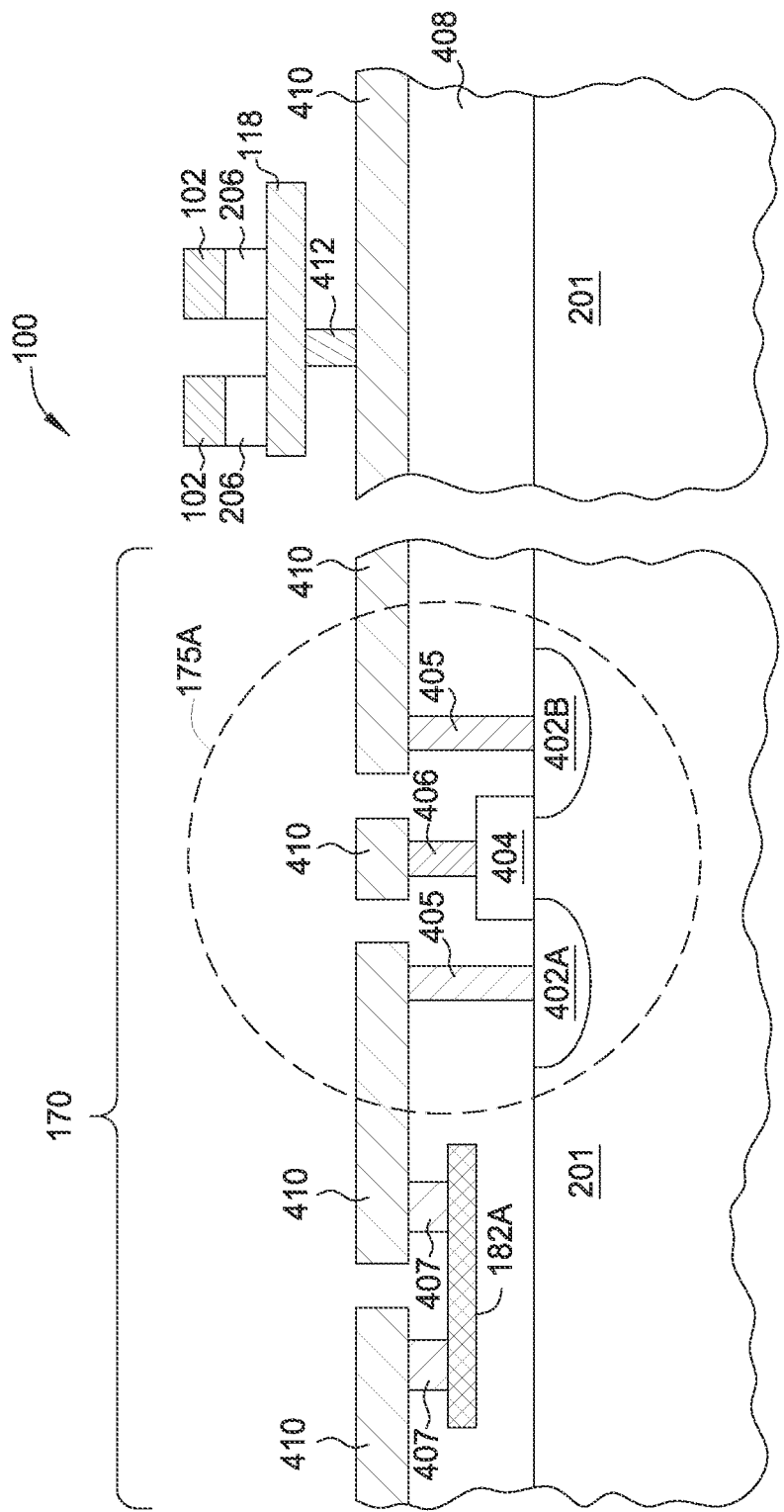
FIG. 4B is a schematic cross-sectional view of a portion of a memory array and a portion of a resistor array having a resistive element disposed therein and in connection with a multiplexer structure, in accordance with certain embodiments.

FIG. 4A is a schematic representation of electrical communication between an illustrative resistor array (e.g., the resistor array 170) and at least one illustrative memory device (e.g., the resistive switching memory cell 200). The resistor array 170 may include the multiplexer 175, and the resistor array 170 and the memory cell may be connected via the electrode 102.

As shown in FIG. 4A, the multiplexer 175 is connected to a plurality of input lines (e.g., the electrodes 171, 172 173, 174) on one end, and an output line (e.g., the electrode 102, thus, being connected to one or more memory cell 200) on the other end. The multiplexer 175 disposed in each resistor array 170 can be connected to the resistive switching memory cell 200 remotely (as shown in FIG. 1) or in any other manner.

Accordingly, the multiplexer 175 is capable of combining two or more input electrical signals from different electrodes, bit lines, word lines, and source-lines. For example, the multiplexer 175 is designed to be capable of receiving input electrical signals (e.g., current or voltage) from the read-and-write circuitry 150 via various source lines and/or input lines (e.g., the electrodes 171, 172, 173, 174), and selecting appropriate sets of resistive elements 181, 182, 183 within the resistor array 170 to be connected in series, and carrying out the command of the electrical signals onto the one or more memory cell 200 via an output line (e.g., the electrode 102).

The multiplexer 175 is generally composed of one or more switches (e.g., transistors) that can be selectively programmed or erased by applying suitable voltages to its electrical terminals. Accordingly, digital logic, instead of analog one, can be used in the memory array 100, having the resistor array 170, to provide different levels of programming currents during the read, write, and erase operations of the memory cells 200. In addition, the resistor array 170 having the multiplexer 175 is compatible to use with low levels of programming currents that are within a compliance current ($I_{CC}$) level as generally required within the industry.

For example, by applying a set voltage ($V_{SET}$, e.g., between about −3 volts and −1 volts) to a desired set of switches located within the multiplexer 175), each of the resistive elements 181, 182, 183, 184 can be turned "on", with its resistance $R_{181}$, $R_{182}$, $R_{183}$, $R_{184}$. Similarly, by applying a reset voltage level (a voltage in opposite polarity to $V_{SET}$, (e.g., between about +1 to +4 volts)) to a desired set of switches within the multiplexer 175, appropriate resistive elements 181, 182, 183, 184 can be turned "off".

In certain embodiments, the output resistance of the resistor array 170 can be chosen to a desirable resistance value to control the resistance of the connected memory cell 200; (i.e., the higher the output resistance of the resistor array 170, the higher the total resistance of the memory cell 200). Thus, the resistance states of the corresponding memory cell 200 can be controlled by connecting to the resistor array 170 having controllable multiple resistances (e.g., more than two resistance values). Such a design is difficult to place inside conventional memory devices having a fixed resistive material or a single resistive switching layer, which provide only one or two resistance states.

The intrinsic resistance $R_{181}$, $R_{182}$, $R_{183}$, $R_{184}$ for each of the resistive elements 181, 182, 183, 184 can be selected and then multiplexed by the use of the multiplexer 175 to provide various desirable programming currents to the memory cell 200. For example, the magnitude of the current, delivered by use of the resistor array 170 is controlled by the selection of the resistivity (p) and the thickness (L) of each of the resistive elements 181, 182, 183, 184 in relation to the size of the resistor array 170 and the applied voltage ($V_{APPLIED}$). For example, the current may be adjusted by adjusting the thickness of the resistive elements 181, 182, 183, 184 and applying a fixed voltage. As an example, for a resistor array 170 with 10 nm×10 nm area, a thickness (L) of between at a thickness of between about 5 Angstroms and 5000 Angstroms for each of the resistive elements 181, 182, 183, 184 may be used to control the current flowing through the resistor array 170 and memory cell 200.

In the configuration of FIG. 4A, at least 4 resistance states with resistance values of the intrinsic resistance $R_{181}$, $R_{182}$, $R_{183}$, $R_{184}$ for each of the resistive elements 181, 182, 183, 184 can be selected and then multiplexed by the multiplexer 175 to provide various desirable programming currents to the memory cell 200 for storing 2 bits of data information (e.g., 4 logic state of "00", "01", "10", and "11") in a simple, easy, controllable manner. For example, the read-and-write circuitry 150 may deliver an electrical signal to controllably turn on an appropriate set of switches, and the multiplexer 175 receiving the electrical signal can select from the desired combinations of the input lines (e.g., the electrodes 171, 172, 173, 174) and connect the resistive elements 181, 182, 183, or 184 within the resistor array 170. The multiplexer 175 can then send the electrical signal to appropriate one or more memory cell 200 via the output line (e.g., the electrode 102, 118). The memory cell 200, connected to the resistor array 170 receiving the electrical signal within the memory array, is then switched into the desired resistance state.

As an example, during programming operation, to achieve a digital logic state of "11", a resistance value of "$R_{184}$" can be chosen by using the multiplexer 175, thus providing a current level (e.g., $I_4$) to the resistive switching layer 206. For a digital logic state "10", a resistance value of "$R_{183}$" can be chosen by using the multiplexer 175, thus providing a current level (e.g., $I_3$) to the resistive switching layer 206. For a digital logic state "01", a resistance value of "$R_{182}$" can be chosen by using the multiplexer 175, thus providing a current (e.g., $I_2$) to the resistive switching layer 206. For a logic state of "00", a resistance value of "$R_{181}$" can be chosen by using the multiplexer 175, thus providing a current (e.g., $I_1$) to the resistive switching layer 206. Thus, the resistor array 170, having the multiplexer 175, is able to selectively provide a desired current level among at least 4 different discrete current levels (e.g., $I_1$, $I_2$, $I_3$, and $I_4$) to the resistive switching layer 206 within a memory cell 200.

According to certain embodiments, a resistor array 170 is provided for storing a desirable number (N) of data bits, and is capable of being programmed to provide a $2^N$ number of resistance states (e.g., $2^2$ resistance states for 2 bit of data) to at least one resistive switching memory element 112 within the memory cells 200. In certain embodiments, the resistor array 170 includes at least $2^N$ number of resistive elements (e.g., $2^2$=4, four resistive elements 181, 182, 183, 184) to be in electrical communication, and connected to the resistive switching memory element 112 in a nonvolatile resistive switching memory device (e.g., the memory cell 200). Each memory cell 200 may contain a first electrode layer (e.g., the electrode 102), a resistive switching layer (e.g., the resistive switching layer 206), and a second electrode layer (e.g., the electrode 118). The resistor array 170 can be connected to at least one memory cell 200 via the first electrode layer. In certain embodiments, by connecting at least one resistor array 170 to at least one memory cell 200, the memory cell 200 is capable of being programmed into $2^N$ resistance states for storing a desirable number (N) of data bits.

Accordingly, for storing N bits of data, at least $2^N$ resistive elements (e.g., $2^2$=4 resistive elements 181, 182, 183, 184, if N=2) within the resistor array are connected in each memory array in $2^N$ number of different series combinations via at least $2^N$ number of electrode layers (e.g., $2^2$=4 electrodes 171, 172, 173, 174) within the resistor array. As a result, the memory array is capable of being programmed into at least $2^N$ logic states ($2^2$=4 logic states of "00", "01", "10", and "11"). Each of the at least $2^N$ resistive elements (e.g., resistive elements 181, 182, 183, 184) of the multi-level resistor array is capable of being programmed into the "on" state resistance and being connected up in different series combinations (e.g., 4 resistive elements 181, 182, 183, or 184) to create at least $2^N$ different resistance values (e.g., $2^2$=4, or $R_{181}$, $R_{182}$, $R_{183}$, $R_{184}$). During programming, each of the at least $2^N$ number of the resistive elements is programmed into a "on" state with a resistance value (R) for providing at least $2^N$ resistance states with resistance values of $R_{181}$, $R_{182}$, $R_{183}$, or $R_{184}$ to the memory cell connected to the resistor array and storing N bits of data in the connected memory cell. Each resistor array includes at least one multiplexer connected to each of the at least $2^N$ number of the resistive elements. The multiplexer is capable of selectively connecting the at least $2^N$ number of the resistive elements to provide a desirable programming current level to at least one memory cell connected to the resistor array. In one example the desirable resistance value to be selected can be chosen among $R_{181}$, $R_{182}$, $R_{183}$, $R_{184}$.

FIG. 4B is a schematic cross-sectional view of a portion of the memory array 100 and a portion of the resistor array 170 having an illustrative resistive element (e.g., a resistive element 182A) disposed therein and in connection with an illustrative multiplexer (a multiplexer 175A), in accordance with certain embodiments. In general, the memory array 100 includes a plurality of memory cells having the electrode 118, the resistive switching layer 206 and the electrode 102. For example, a portion of the resistor array 170 may include the resistive element 182A and the multiplexer 175A For forming each memory cell 200, a dielectric layer 408 can be deposited on the surface of the substrate 201. A metal conductive layer 410 may be formed over the surface of the dielectric layer 408. A metal layer 412 is then formed over the surface of the metal conductive layer 410. The electrode 118 is then formed over the surface of the metal layer 412 prior to forming the resistive switching layer 206 and the electrode 102.

As shown in FIG. 4B, for forming the resistor array 170, the resistive element 182A may be formed over the surface of the substrate 201. Then, a metal layer 407 and the metal conductive layer 410 may be formed over the surface of the resistive element 182A for connecting to other material layers disposed on the substrate 201. For example, the metal conductive layer 410 may be used to connect the resistive element 182A to a portion of the multiplexer 175A, which is formed over the over the surface of the same substrate 201 as the resistive element 182A.

The multiplexer 175A may include source and drain regions 402A, 402B, which may be a MOS type transistor structure, formed over the surface of the substrate 201. The multiplexer 175A may further include a gate electrode layer 404 formed over the surface of the substrate 201 and a number of metal layers 405, 406 formed over the surface of the source and drain regions 402A, 402B, and the gate electrode layer 404, respectively. Next, the metal conductive layer 410 may be deposited over the surface of the metal layers 405, 406. Accordingly, the metal conductive layer 410 can be to connect the multiplexer 175A to the resistive element 182A and/or the memory cell 200 disposed over the surface of the substrate 201.

Figure 4C:
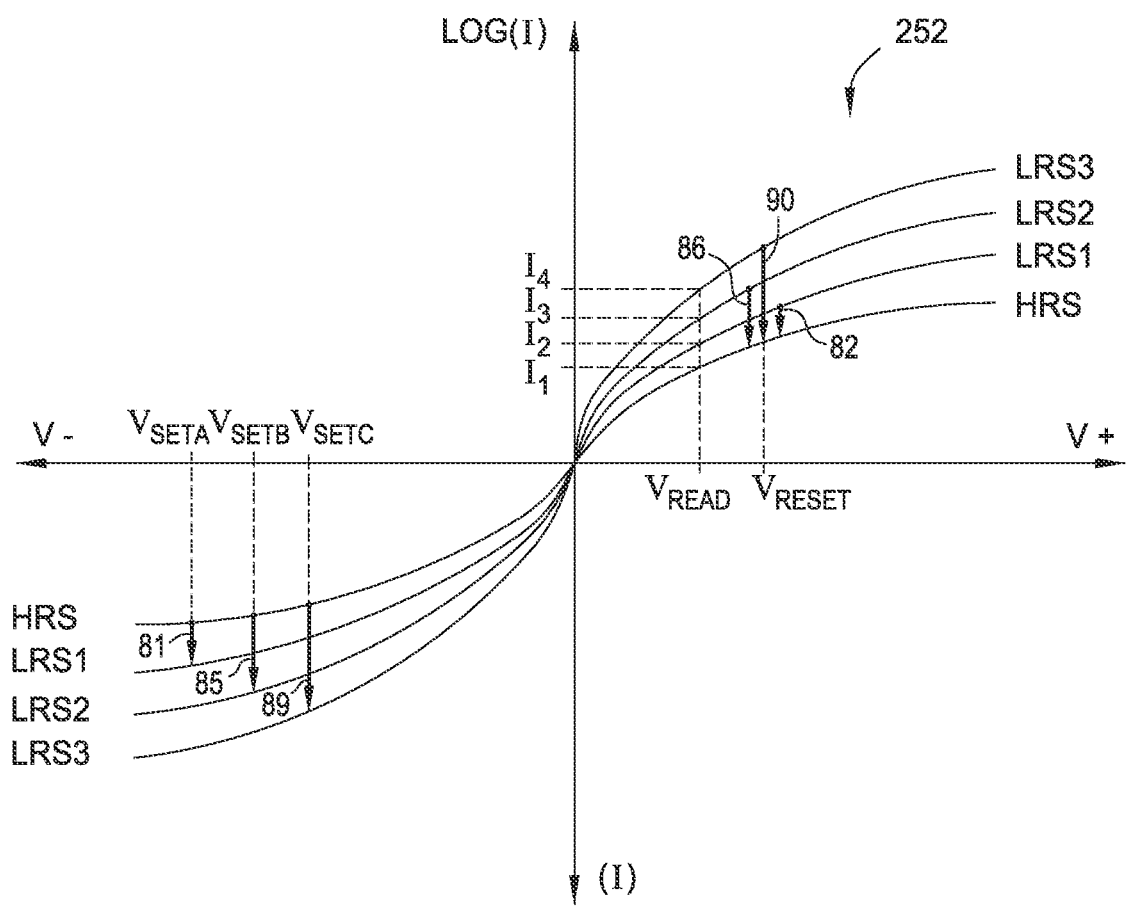
FIG. 4C is a current (I) versus voltage (V) plot illustrating electroforming and switching characteristics of an illustrative memory cell connected with at least one resistor array, in accordance with certain embodiments.

FIG. 4C is a current (I) versus voltage (V) plot illustrating electroforming and switching characteristics of an illustrative memory cell (e.g., the memory cell 200) connected with at least one resistor array (e.g., the resistor array 170), in accordance with certain embodiments. In general, the resistor array 170 may include a plurality of the resistive elements to place the memory cell 200 at multiple resistance states (e.g., High resistance state (HRS), Low resistance state 1 (LRS1), Low resistance state 2 (LRS2), Low resistance state 3 (LRS3), Low resistance state 4 (LRS4), . . . etc.) for storing more than one bit of data in the resistive switching element 112 of the memory cell 200. For example, the resistor array 170 may be capable of placing the memory cell in $2^N$ number of resistance states for storing N bits of data in the memory cell 200, where N is a natural number of more than one (1).

As shown in FIG. 4C, for storing two (2) bits of data in the memory cell 200, as an example, the resistive switching memory element 112 of memory cell 200 may be able to switch between four (4) resistance states, such as High resistance state (HRS), Low resistance state 1 (LRS1), Low resistance state 2 (LRS2), Low resistance state 3 (LRS3). Thus, once the memory cell 200 is formed on the substrate 201, the memory cell 200 may be initially at a logic "off" state (e.g., "00" state, with a high resistance value, HRS). Then, if desirable, the memory cell 200 can be turned "on" by switching from HRS to LRS1 by applying a Set voltage level A ($V_{SETA}$), following an arrow direction 81, to be at a first "on" state (e.g., "01" state, with a low resistance value, LRS1). Next, if desirable, the memory cell 200 can be turned "off" by switching from LRS1 to HRS by applying a Reset voltage level ($V_{RESET}$), following an arrow direction 82, to be at the "off" state.

Then, if desirable, the memory cell 200 can be turned "on" again by switching from HRS to LRS2 by applying a Set voltage level B ($V_{SETB}$), following an arrow direction 85, to be at a second "on" state (e.g., "10" state, with a low resistance, LRS2). Next, if desirable, the memory cell 200 can be turned "off" by switching from LRS2 to HRS by applying a Reset voltage level ($V_{RESET}$), following an arrow direction 86, to be at the "off" state.

Similarly, if desirable, the memory cell 200 can be turned "on" again by switching from HRS to LRS3 by applying a Set voltage level C ($V_{SETC}$), following an arrow direction 89, to be at a third "on" state (e.g., "11" state, with a low resistance value, LRS3). Next, if desirable, the memory cell 200 can be turned "off" by switching from LRS3 to HRS by applying a Reset voltage level ($V_{RESET}$), following an arrow direction 90, to be at the "off" state.

Figure 5:
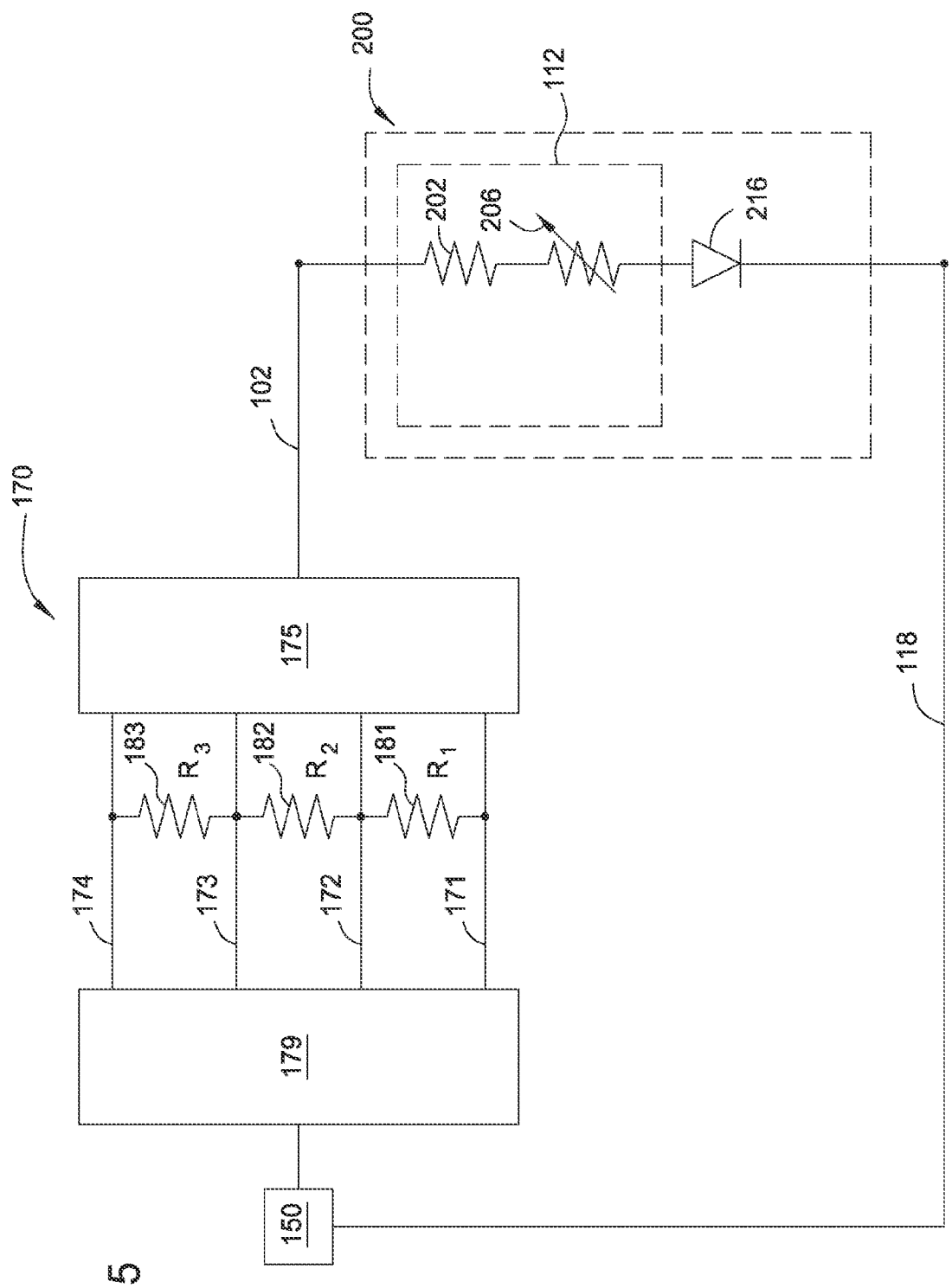
FIG. 5 is a schematic representation of one example of electrical communication between an illustrative resistor array and an illustrative memory device, in accordance with certain embodiments.

FIG. 5 schematically illustrates another illustrative electrical communication between a resistor array (e.g., the resistor array 170) and at least one illustrative memory device (e.g., the memory cell 200). The resistor array 170 may include a de-multiplexer 179 and the multiplexer 175, and the resistor array 170 and the memory cell 200 may be connected via the electrode 102 and/or the electrode 118.

As shown in FIG. 5, the de-multiplexer 179 is connected to an input line on one end and a plurality of output lines (e.g., the electrodes 171, 172 173, 174) on the other end. In addition, the multiplexer 175 is connected to a plurality of the input lines (e.g., the electrodes 171, 172 173, 174) on one end and an output line (e.g., the electrode 102) on the other end. The plurality of resistive elements 181, 182, 183 can be connected to one or more memory cell 200. The de-multiplexer 179 and the multiplexer 175 disposed in each resistor array 170 can be connected to the memory cell 200 remotely (as shown in FIG. 1) or in any other manner.

The intrinsic resistance $R_{181}$, $R_{182}$, $R_{183}$ for each of the resistive elements 181, 182, 183 can be selected by choosing the material and thickness of the resistive elements 181, 182, 183. Then, when a voltage is applied to the memory cell 200, various resistance values are provided to the memory cell 200 by the use of the de-multiplexer 179 and the multiplexer 175, such that various desirable programming currents are provided the memory cell 200.

Accordingly, the de-multiplexer 179 is capable of directing one input line into two or more output electrical signals delivered to different electrodes, bit lines, word lines, and source-lines. For example, the de-multiplexer 179 is designed to function together with the multiplexer 175, and to be capable of receiving input electrical signals (e.g., current or voltage) from the read-and-write circuitry 150 via various source lines and/or input lines, and selecting appropriate sets of resistive elements 181, 182, 183 within the resistor array 170 to be connected in series, and carrying out the command of the electrical signals onto the one or more memory cell 200 via an output line (e.g., the electrode 102).

The de-multiplexer 179 is generally composed of one or more switches (e.g., transistors) that can be selectively programmed or erased by applying suitable voltages to its electrical terminals. Accordingly, digital logic, instead of analog one, can be used in the resistor array 170, to provide different levels of programming currents during the read, write, and erase operations of the memory cells 200.

As shown in FIG. 5, the resistor array 170 may include, for example, a plurality of resistive elements 181, 182, 183 to be selectively connected "in series" by a number of electrodes 171, 172, 173, 174. Each resistive element within each resistor array 170 can be accessed individually or in groups using appropriate sets of word-lines and bit-lines, conveniently formed by one or more conductive layers, (e.g., the electrodes 171, 172, 173, 174).

In certain embodiment, the resistor array 170 may be capable of placing the memory cell in $2^N$ number of resistance states for storing N bits of data in the memory cell 200, where N is a natural number of more than one (1). Providing three resistive elements, 181, 182, 183 generally results in at least 8 possible resistance combinations of zero (0) resistance, ($R_{181}$), ($R_{182}$), ($R_{183}$), ($R_{181}$+$R_{182}$), ($R_{182}$+$R_{183}$), ($R_{181}$+$R_{183}$), ($R_{181}$+$R_{182}$+$R_{183}$). Thus, the resistor array 170 may be capable of placing the memory cell in $2^3$=8 number of resistance states for storing three (3) bits of data in the memory cell 200 (i.e., $2^N$ number of resistance state, where N is a natural number of three (3)).

In certain embodiments, for ease of design and simpler logic control, the resistive elements 181, 182, 183, 184 and additional resistive elements are fabricated with the same resistive material and with the same thickness such that each of the resistive elements 181, 182, 183, each have a consistent resistance value, R (e.g., $R_{181}$=$R_{182}$=$R_{183}$). For example, each resistive element in the resistor array is capable of being programmed to have the same resistance value (R) by adjusting the material and thickness of each resistive element and placing the at least one resistive switching memory element to a desirable resistance equals to M*R, where M is an integer that varies between 1 and $2^N$. In this configuration, by selectively connecting different combinations of input lines and output line, at least $2^N$=4 resistance states (where N=2) with resistance values of "0", "1R", "2R", and "3R" can be provided to the connected memory cell 200 for storing 2 bits of data information (e.g., 4 logic states of "00", "01", "10", and "11") in a simple, easy, controllable manner.

For example, the read-and-write circuitry 150 may deliver an electrical signal to controllably turn on an appropriate set of switches, and the de-multiplexer 179 receiving the electrical signal can select from the desired combinations of the input lines (e.g., the electrodes 171, 172, 173, 174) and connect the resistive elements 181, 182, 183 within the resistor array 170 in different series combinations. The multiplexer 175 can then send the electrical signal to appropriate one or more memory cell 200 via the output line (e.g., the electrode 102, 118). The memory cell 200, connected to the resistor array 170 receiving the electrical signal within the memory array 100, is then switched into the desired resistance state. As an example, during programming operation, to achieve a digital logic state of "11", a resistance value of "3R" can be chosen to turn on the memory cell 200 and, thus, provide a current level (e.g., $I_3$) to the resistive switching layer 206. For a digital logic state "10", a resistance value of "2R" can be chosen and provide a current level (e.g., $I_2$) to the resistive switching layer 206. For a digital logic state "01", a resistance value of "1R" can be chosen to provide a current (e.g., $I_1$) to the resistive switching layer 206. After programming, a logic state of "00" is obtained by applying a voltage of the opposite polarity (e.g., $V_{RESET}$ for "off" logic state) and delivering an "off" state current level (e.g., $I_{off}$) to the resistive switching layer 206. Thus, the resistor array 170, having the multiplexer 175 and/or the de-multiplexer 179, is able to selectively provide a desired current level among at least 4 different discrete current levels (e.g., $I_1$, $I_2$, $I_3$, and $I_{off}$) to the resistive switching layer 206 within the memory cell 200.

According to certain embodiments, a resistor array 170 is provided for storing a desirable number (N) of data bits, and is capable of being programmed to provide a ($2^N$) number of resistance states to at least one resistive switching memory element 112 within the memory cells 200. In certain embodiments, the resistor array 170 includes a plurality of resistive elements (to be in electrical communication, and connected in series combinations, to the resistive switching memory element 112 in a nonvolatile resistive switching memory device (e.g., the memory cell 200). Each memory cell 200 may contain a first electrode layer (e.g., the electrode 102), a resistive switching layer (e.g., the resistive switching layer 206), and a second electrode layer (e.g., the electrode 118). The resistor array 170 can be connected to at least one memory cell 200 via the first electrode layer. In certain embodiments, by connecting at least one resistor array 170 to at least one memory cell 200, the memory cell 200 is capable of being programmed into $2^N$ resistance states for storing a desirable number (N) of data bits.

The number of the resistive element can be at least $2^N$-1 number of resistive elements, or alternatively, $2^N$ number of resistive elements. For example, for storing 2 bit of data, three resistive elements 181, 182, 183, ($2^2$-1=3) or four resistive elements 181, 182, 183, 184 ($2^2$=4) can be used, as discussed above. Accordingly, for storing N bits of data, at least $2^N$-1 resistive elements (e.g., at least three resistive elements 181, 182, 183, if N=2) within the resistor array are connected in each memory array in $2^N$ number of different series combinations via at least $2^N$ number of electrode layers (e.g., $2^2$=4 electrodes 171, 172, 173, 174) within the resistor array. As a result, the memory array is capable of being programmed into at least $2^N$ logic states ($2^2$=4 logic states of "00", "01", "10", and "11"). Each of the at least $2^N$-1 resistive elements (e.g., resistive elements 181, 182, 183) of the multi-level resistor array is capable of being programmed into the "on" state resistance and being connected up in different series combinations (e.g., 3 resistive elements 181+182+183; two resistive elements 181+182; one resistive element 181; or no resistive element connected) to create at least $2^N$ different resistance values (e.g., 3R, 2R, 1R, and 0R). During programming, each of the at least $2^N$-1 number of the resistive elements is programmed into a "on" state with a resistance value (R) for providing at least $2^N$ resistance states with resistance values of zero resistance, one resistance (R), two resistances (2R), three resistances (3R), . . . , and ($2^N$-1)R to the memory cell connected to the resistor array and storing N bits of data in the connected memory cell. Each resistor array includes at least one multiplexer and/or de-multiplexer connected to each of the at least $2^N$-1 number of the resistive elements. The multiplexer is capable of selectively connecting the at least $2^N$-1 number of the resistive elements to provide a desirable programming current level to at least one memory cell connected to the resistor array. In one example, the desirable resistance value to be selected can be chosen among zero resistance, one resistance (R), two resistances (2R), three resistances (3R), . . . , and ($2^N$-1)R.

In certain embodiments, each memory cell or device in a memory chip is connected with at least one multi-level resistor array, so that a desired resistance can be selectively connected in series with a resistive switching layer (e.g., the resistive switching layer 206) found in the resistive switching memory element 112 of the connected memory cell 200. In the same or other embodiments, a three-dimensional (3D) multi-level resistor array is formed and connected to a set of memory cells formed within the memory chip so that the different discrete resistive elements in the 3D multi-level resistor array can be selectively connected to one or more of the memory cells in different series combinations to control measured resistance of this combination of resistive elements, and thus store multiple bits of digital information.

In certain embodiments, a memory array (e.g., the memory array 100) for storing a desirable number (N) of data bits is formed by depositing at least $2^N$-1 layers of resistive elements (e.g., three (3) resistive elements 181, 182, 183 for two bit of data and 4 logic states of "00", "01", "10", "11", as shown in FIG. 5) above the surface of the substrate 201 to form a resistor array (e.g., the resistive array 170). In certain embodiments, at least $2^N$ layers of resistive elements (e.g., four (4) resistive elements 181, 182, 183, 184 for two bit of data and 4 logic states of "00", "01", "10", "11", as shown in FIG. 4A)

In addition, at least one resistive switching memory device (e.g., the memory cell 200) is also formed above the surface of the substrate 201, such that the resistive switching memory device is capable of being at $2^N$ number of resistance states. An electrode layer (e.g., the electrode 102) is also formed above the surface of the substrate 201 to connect the resistor array (e.g., the resistive array 170) with the resistive switching memory device (e.g., the memory cell 200). In another embodiment, the $2^N-1$ layers of resistive elements are deposited sequentially so as to be electrically connected in $2^N$ number of different series combinations, once formed. In still another embodiment, a memory array for storing a desirable number (N) of data bits is formed by providing a formed resistor array, which comprises $2^N-1$ layers of resistive elements and $2^N$ layers of electrodes, and connecting a first electrode layer of a formed resistive switching memory device with at least one of the $2^N$ layers of the electrodes of the resistor array. Each of the $2^N-1$ layers of resistive elements is capable of being connected and turned "on" to have a resistance value (R), such that the at least one resistive switching memory cell, after being connected to the resistor array, is capable of being at $2^N$ number of resistance states.

In yet another embodiment, a method of storing N bits of data is provided by connecting $2^N-1$ layers of resistive elements of a resistor array in $2^N$ number of different series combinations via $2^N$ number of electrode layers within the resistor array. Next, a plurality of memory cells is connected with the resistor array such that at least one of the plurality of the memory cell is capable of being at $2^N$ number of resistance states for storing N bits of data. In addition, a multiplexer is connected to each of the at least $2^N-1$ number of the resistive elements of the resistor array. The multiplexer is capable of selectively connecting the at least $2^N-1$ number of the resistive elements in $2^N$ number of different series combinations via the $2^N$ number of electrode layers to provide a desirable resistance value to the at least one resistive switching memory cell. In certain embodiments, the multiplexer in a memory array for storing N bits of data is able to select and choose a desirable resistance value among zero resistance, one resistance (R), two resistances (2R), three resistances (3R), . . . , and $(2^N-1)R$.

The foregoing is merely illustrative of the principles of the described methods and structures and various modifications can be made by those skilled in the art without departing from the scope and spirit of the invention as defined by the claims that follow.

The invention claimed is:

1. A device comprising:
a resistive switching memory element operable to switch between at least two resistive states,
a resistor array comprising multiple resistive elements; and
a multiplexer connected in series with the resistive switching memory element and the resistor array,
the multiplexer configured to selectively interconnect the multiple resistive elements in series to form different series combinations having different resistances and to connect each of the multiple resistive elements or each of the different series combinations to the resistive switching memory element.

2. The device of claim 1, wherein the resistive switching memory element is configured to store N bits of data, wherein N is a natural number of more than one.

3. The device of claim 2, wherein a number of the different resistances available from the one or more of the multiple resistive elements interconnected by the multiplexer is at least 2N.

4. The device of claim 1, wherein the multiplexer comprises multiple switches, each of the multiple switches connected to a different one of the multiple resistive elements for selectively connecting each of the of the multiple resistive elements to form the different series combinations.

5. The device of claim 4, wherein the multiple switches are transistors.

6. The device of claim 1, wherein each of the multiple resistive element comprises one of n-type semiconductor materials, p-type semiconductor materials, doped polysilicon materials, low bandgap semiconductor materials, amorphous silicon, zinc oxide ($Zn_xO_y$), metal nitride materials, silicon nitride ($Si_xN_{1-x}$), hafnium nitride ($Hf_xN_y$), tantalum nitride ($Ta_xN_y$), titanium nitride ($Ti_xN_y$), ternary intermetallic materials, tantalum silicon nitride ($Ta_xSi_yN_z$), titanium silicon nitride ($Ti_xSi_yN_z$), titanium aluminum nitride ($Ti_xAl_yN_z$), ceramic metal alloy materials, chromium silicon oxide ($Cr_xSi_yO_z$), and combinations thereof.

7. The device of claim 1, wherein the resistive switching memory element comprises one of hafnium oxide ($Hf_xO_y$), tantalum oxide ($Ta_xO_y$), aluminum oxide ($Al_xO_y$), lanthanum oxide ($La_xO_y$), yttrium oxide ($Y_xO_y$), dysprosium oxide ($Dy_xO_y$), ytterbium oxide ($Yb_xO_y$), or zirconium oxide ($Zr_xO_y$).

8. The device of claim 1, further comprising a current steering device connected in series with the resistive switching memory element and the resistor array.

9. The device of claim 8, wherein the current steering device is a p-n junction diode, a p-i-n diode, or a transistor.

10. The device of claim 8, wherein the current steering device comprises a p-doped silicon layer, an un-doped intrinsic layer, and an n-doped silicon layer and wherein the current steering device has a resistance of between about 1 kOhm and about 100 MOhm.

11. The device of claim 1, wherein the multiple resistive elements have same resistances.

12. The device of claim 1, further comprising a read-write circuitry connected in series with the resistor array.

13. The device of claim 12, wherein the read-write circuitry controls operation of the multiplexer.

14. The device of claim 12, wherein the read-write circuitry controls operation of the multiplexer by applying a controlled voltage to one or more of multiple switches of the multiplexer, wherein each of the multiple switches is connected to a different one of the multiple resistive elements for selectively connecting each of the of the multiple resistive elements to form the different series combinations.

15. The device of claim 1, wherein the resistive switching memory element is a part of a cross point memory array.

16. The device of claim 15, wherein the resistor array is a part of the cross point memory array.

17. The device of claim 1, wherein electrodes connecting each of the multiple resistive element to the multiplexer and connecting the resistive switching memory to the multiplexer are word-lines and orthogonal bit-lines of a crossbar memory array.

18. The device of claim 17, wherein the electrodes comprises one p-type polysilicon, n-type polysilicon, a transition metal alloy, a transition metal nitride, or a transition metal carbide.

19. The device of claim 18, wherein the electrodes comprises titanium nitride.

20. The device of claim 19, further comprising a current steering device connected in series with the resistive switching memory using an intermediate electrode comprising polysilicon.

* * * * *